United States Patent [19]
Acharya

[11] Patent Number: 6,009,201
[45] Date of Patent: Dec. 28, 1999

[54] EFFICIENT TABLE-LOOKUP BASED VISUALLY-LOSSLESS IMAGE COMPRESSION SCHEME

[75] Inventor: Tinku Acharya, Tempe, Ariz.

[73] Assignee: Intel Corporation, Santa Clara, Calif.

[21] Appl. No.: 08/884,923

[22] Filed: Jun. 30, 1997

[51] Int. Cl.[6] .............................. G06K 9/36; G06K 9/46
[52] U.S. Cl. ..................... 382/232; 382/238; 382/239; 382/246
[58] Field of Search ........................... 382/232, 237–239, 382/246, 251, 233; 358/426, 261.2, 427, 430, 539; 348/207, 231, 390, 394, 400, 405, 410

[56] References Cited

U.S. PATENT DOCUMENTS

| | | | |
|---|---|---|---|
| 5,325,126 | 6/1994 | Keith | 348/418 |
| 5,341,442 | 8/1994 | Barrett | 382/166 |
| 5,563,655 | 10/1996 | Lathrop | 348/231 |
| 5,680,129 | 10/1997 | Weinberger et al. | 341/65 |

OTHER PUBLICATIONS

A.N.Netravali and B.G.Haskell, "Digital Pictures: representation, compression, and standards", 2nd ed., Plenum Press, p. 588, 1995.

*Primary Examiner*—Bijah Tadayon
*Assistant Examiner*—Dmitry A. Novik
*Attorney, Agent, or Firm*—Blakely, Sokoloff, Taylor & Zafman LLP

[57] ABSTRACT

An image compression scheme is disclosed which models the human visual perception system. Using quantization of image error values, according to a visually-lossless scheme, an image can be compressed such that it is visually indistinguishable to the naked eye from the original image. To aid in image compression on portable devices such as a digital camera, the quantization can be precoupled into a look-up table.

19 Claims, 6 Drawing Sheets

| Error Value | Quantized Error Value | Codeword Equivalent | Length | Inverse |
|---|---|---|---|---|
| -255 | -15 | 110000 | 6 | -253 |
| -231 | -15 | 110000 | 6 | -253 |
| -230 | -14 | 110001 | 6 | -209 |
| -188 | -13 | 110010 | 6 | -170 |
| -151 | -12 | 110011 | 6 | -135 |
| -119 | -11 | 110100 | 6 | -105 |
| -91 | -10 | 110101 | 6 | -79 |
| -67 | -9 | 110110 | 6 | -57 |
| -47 | -8 | 110111 | 6 | -39 |
| -31 | -7 | 10000 | 5 | -25 |
| -19 | -6 | 10001 | 5 | -14 |
| -10 | -5 | 10010 | 5 | -8 |
| -5 | -4 | 10011 | 5 | -4 |
| -3 | 0 | 0 | 1 | 0 |
| 3 | 0 | 0 | 1 | 0 |
| 5 | 4 | 10100 | 5 | 4 |
| 10 | 5 | 10101 | 5 | 8 |
| 19 | 6 | 10110 | 5 | 14 |
| 31 | 7 | 10111 | 5 | 25 |
| 47 | 8 | 111000 | 6 | 39 |
| 67 | 9 | 111001 | 6 | 57 |
| 91 | 10 | 111010 | 6 | 79 |
| 119 | 11 | 111011 | 6 | 105 |
| 151 | 12 | 111100 | 6 | 135 |
| 188 | 13 | 111101 | 6 | 170 |
| 230 | 14 | 111110 | 6 | 209 |
| 255 | 15 | 111111 | 6 | 253 |

| Error Value | Quantized Error Value | Codeword Equivalent | Length | Inverse |
|---|---|---|---|---|
| -255 | -15 | 110000 | 6 | -253 |
| -231 | -15 | 110000 | 6 | -253 |
| -230 | -14 | 110001 | 6 | -209 |
| -188 | -13 | 110010 | 6 | -170 |
| -151 | -12 | 110011 | 6 | -135 |
| -119 | -11 | 110100 | 6 | -105 |
| -91 | -10 | 110101 | 6 | -79 |
| -67 | -9 | 110110 | 6 | -57 |
| -47 | -8 | 110111 | 6 | -39 |
| -31 | -7 | 10000 | 5 | -25 |
| -19 | -6 | 10001 | 5 | -14 |
| -10 | -5 | 10010 | 5 | -8 |
| -5 | -4 | 10011 | 5 | -4 |
| -3 | 0 | 0 | 1 | 0 |
| 3 | 0 | 0 | 1 | 0 |
| 5 | 4 | 10100 | 5 | 4 |
| 10 | 5 | 10101 | 5 | 8 |
| 19 | 6 | 10110 | 5 | 14 |
| 31 | 7 | 10111 | 5 | 25 |
| 47 | 8 | 111000 | 6 | 39 |
| 67 | 9 | 111001 | 6 | 57 |
| 91 | 10 | 111010 | 6 | 79 |
| 119 | 11 | 111011 | 6 | 105 |
| 151 | 12 | 111100 | 6 | 135 |
| 188 | 13 | 111101 | 6 | 170 |
| 230 | 14 | 111110 | 6 | 209 |
| 255 | 15 | 111111 | 6 | 253 |

EFFICIENT TABLE-LOOKUP BASED VISUALLY-LOSSLESS IMAGE COMPRESSION SCHEME

BACKGROUND OF THE INVENTION

1. Field of the Invention

The invention relates generally to the field of digital imaging and computer graphics. More specifically, the invention relates to methods for performing digital image processing and compression.

2. Description of the Related Art

In small, portable devices such as digital still cameras, image compression schemes should be suited to reduce the storage requirements and processing time of captured sensor images still maintaining acceptable picture quality even after compression and decompression. When storage requirements and processing time are reduced, the overall power consumption of the device is also reduced since the VLSI (Very Large Scale Integration) chip performing the processing is more compact. The reduction of the bit rate for transmission or storage of still image and motion video will also speed the process of capturing images and thus, speed the downloading of them to a PC (personal computer) or other more complex data processing systems. Quick capture and compression of an image will allow such cameras to transition to the next image, i.e., to the next click of the camera speedily.

Image compression, whether performed by hardware such as VLSI chip or by software, can be classified as either "lossy" or "lossless". With lossless compression, the original image prior to compression can be retrieved exactly when the compressed image is decompressed. Consequently, lossless techniques, whose compression ratios depend greatly upon the entropy of an image, do not achieve high compression ratios and, since they preserve a high percentage of original image information, are computationally expensive. By contrast, lossy compression provides only an approximation of the original image. Thus, with lossy compression, greater compression ratios can be achieved but traditionally with lower image quality compared to lossless techniques. One such lossy technique, referred to as "predictive coding" (also called Digital Pulse Code Modulation (DPCM), well-known in the art), predicts the value of a successive pixel by linearly combining the properties of already processed neighboring pixels. An error pixel is defined as the difference between the original image pixel and the corresponding predicted pixel. The error pixel, represented as a color value, is quantized and then binary encoded. Traditionally, the quantization has been performed distinct from the encoding, which lends to complexity in the processing circuitry.

Even with lossy compression schemes, the process of quantization and encoding is often very compute intensive. Thus, it would be desirable to reduce or eliminate the computing of quantization and encoding within a small device such as a digital camera. Doing so would reduce the circuitry or chip area required and also, the power consumption.

With lossy techniques, as traditionally employed, image quality suffers. It would also be desirable in situations where captured image quality is important, such as a digital camera, to employ a compression scheme that is "visually-lossless". A "visually-lossless" scheme would technically be lossy, but due to certain properties would model the human visual system. To the naked eye, images compressed using a "visually-lossless" scheme would appear approximately identical to the original image.

The implementation of such computationally intensive techniques demands more VLSI circuitry than is suitable for digital cameras and portable, small devices desiring image compression. Thus, there is a need for a more efficient process to perform techniques while conserving power. Also, there is a need to preserve image quality as it relates to the human visual system such that a lossy image appears to the unaided eye as "lossless".

SUMMARY OF THE INVENTION

A method having the step of compiling an image compression table that models a visually-lossless image compression scheme. The image compression scheme is based upon the human visual perception system, and is utilized for compressing an image which appears visually-lossless upon decompression.

BRIEF DESCRIPTION OF THE DRAWINGS

The objects, features and advantages of the method and apparatus for the present invention will be apparent from the following description in which.

DETAILED DESCRIPTION OF THE INVENTION

Referring to the figures, exemplary embodiments of the invention will now be described. The exemplary embodiments are provided to illustrate aspects of the invention and should not be construed as limiting the scope of the invention. The exemplary embodiments are primarily described with reference to block diagrams or flowcharts. As to the flowcharts, each block within the flowcharts represents both a method step and an apparatus element for performing the method step. Depending upon the implementation, the corresponding apparatus element may be configured in hardware, software, firmware or combinations thereof.

Figure 1:
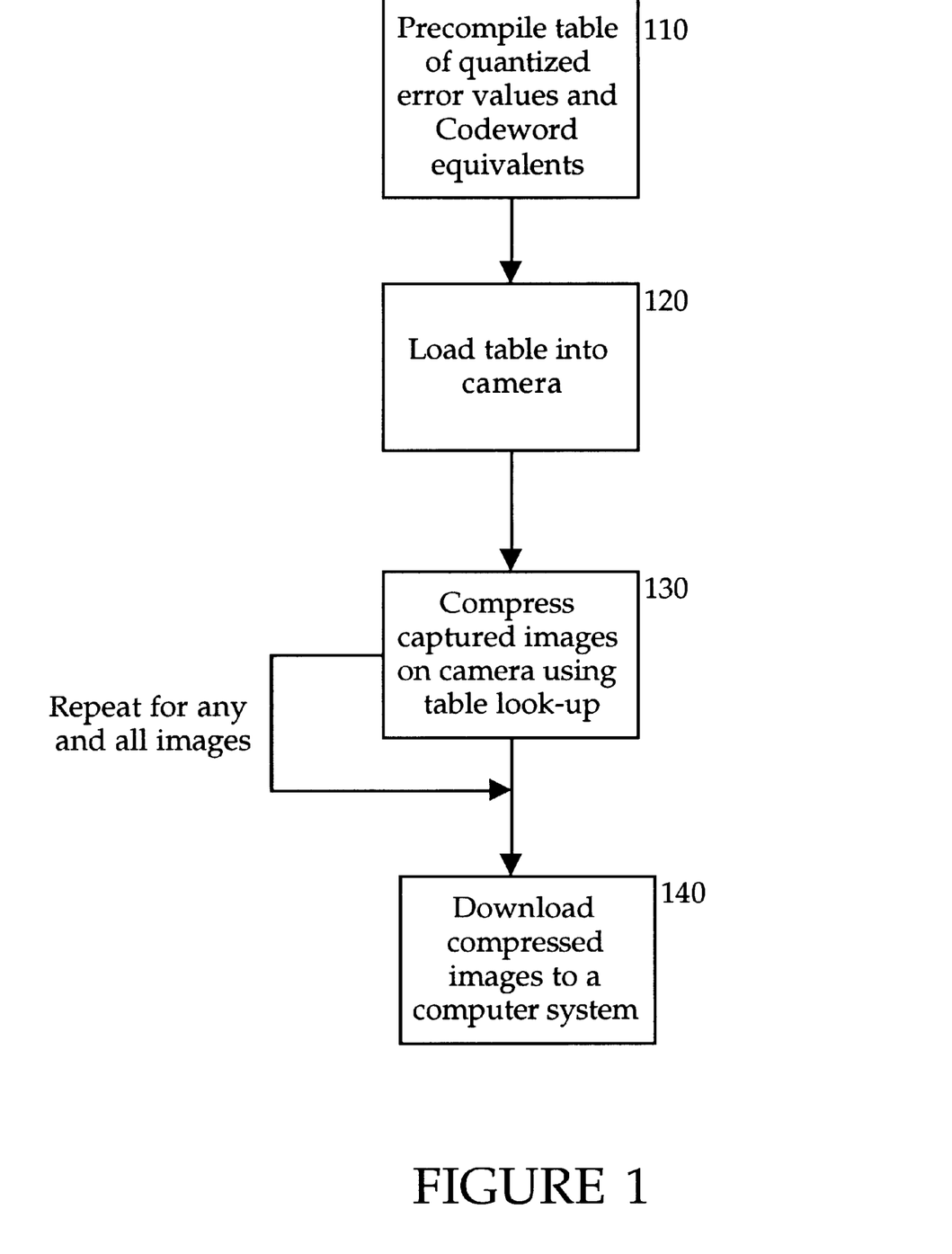
FIG. 1 is a flowchart of one embodiment of the invention.

FIG. 1 is a flowchart of one embodiment of the invention.

In this embodiment, one step in attaining a compact and efficient image compression is to pre-compile a table of quantized error values and codes (step 110). The total number of possible error values, where error is defined as the difference between a predicted pixel (or average of pixels) and the current pixel, will be based on the desired color resolution of each pixel (described below). For each possible error value, a corresponding quantized error value is calculated by some data processing system such as a computer. As will be detailed below, each quantized error value will have a Huffman (or other entropy encoding) code equivalent. Huffman coding is well-known in the art of digital encoding and data compression. A single table of integrated original quantized error values, and Huffman code equivalents and the like will be stored in table form on the data processing system.

Once the table is pre-compiled, prior to any image capture or compression, the table is loaded into RAM (Random Access Memory) or ROM (Read Only Memory) units within the camera (step 120). Since memory is inexpensive and power-preserving compared to logic/arithmetic circuitry, pre-compiling such a table offers significant cost and design advantages.

Figure 3:
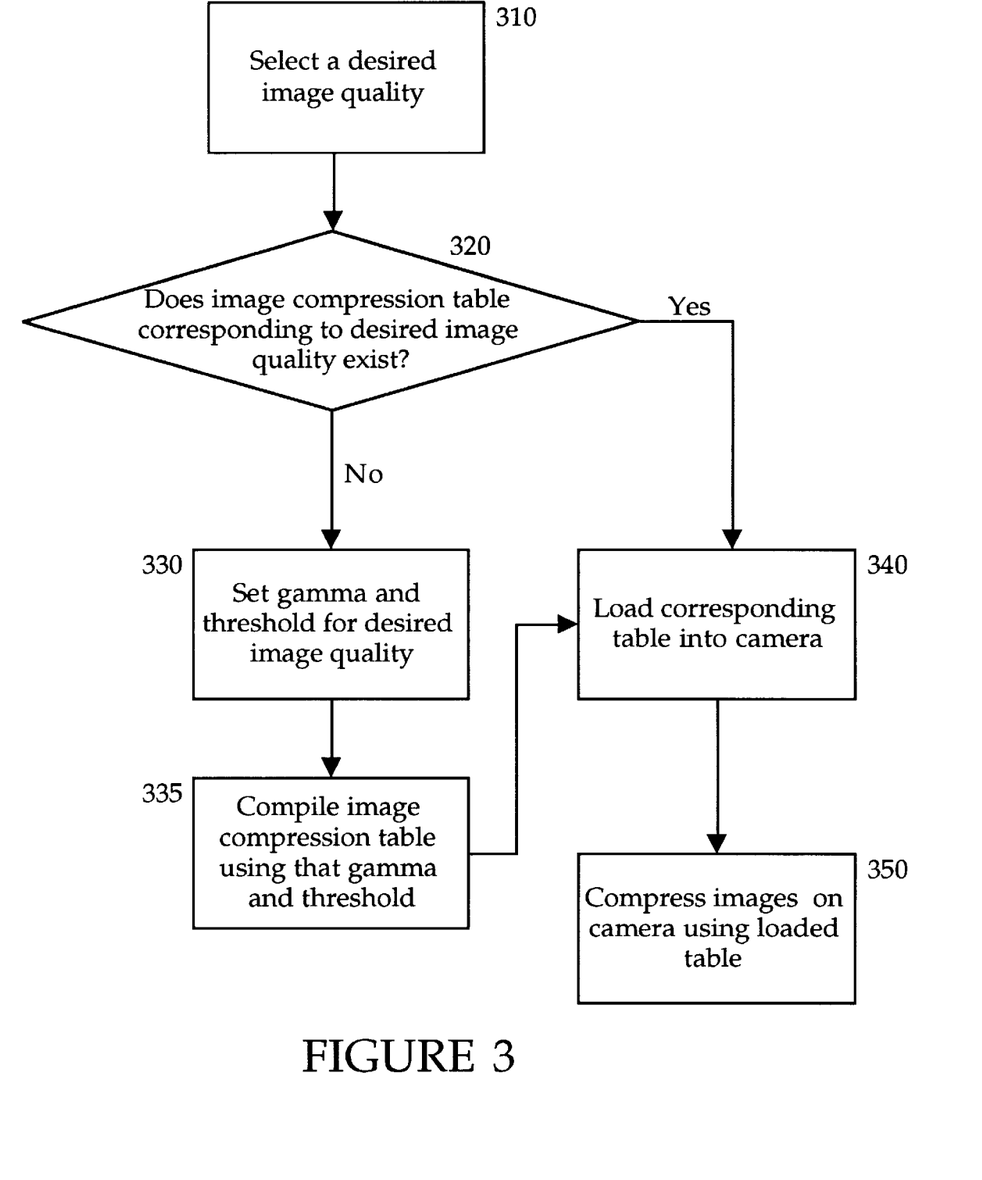
FIG. 3 is a flowchart of yet another embodiment of the invention.

Once the table is loaded into the camera, for the image compression scheme represented by that table, the table need not be re-compiled or reloaded. As shown in FIG. 3, if the image compression scheme changes, the table can be re-compiled and loaded to replace or append the prior table. According to step 130, images that are captured by the lens-sensor system of the camera can be compressed on-the-fly using a look-up table approach. The captured pixels are composed of R, G, and B (Red, Green and Blue) color planes, and the procedure of predictive coding is applied to each captured pixel in the R, G, and B planes simultaneously.

When the image is completely captured and compressed, the next image may be similarly processed, without any reload or re-compile of the table. Either one by one, or in groups, the compressed images may then be downloaded to a data processing or computer system which can perform decompression of the image(s) (step 140). Utilizing the "visually-lossless" approach described below, the resultant image will appear to the eye as a near perfect reconstruction of the captured image. An advantage to the methodology of table look-up compression is the speed at which a captured image can be compressed, thus allowing the camera to be ready to capture the next image. A further advantage is that the decompression, which decodes and inverse quantizes to approximate the captured image, can also be achieved using the same table loaded to the camera. These details, as well as the visually-lossless algorithm, are described below.

Figure 2:
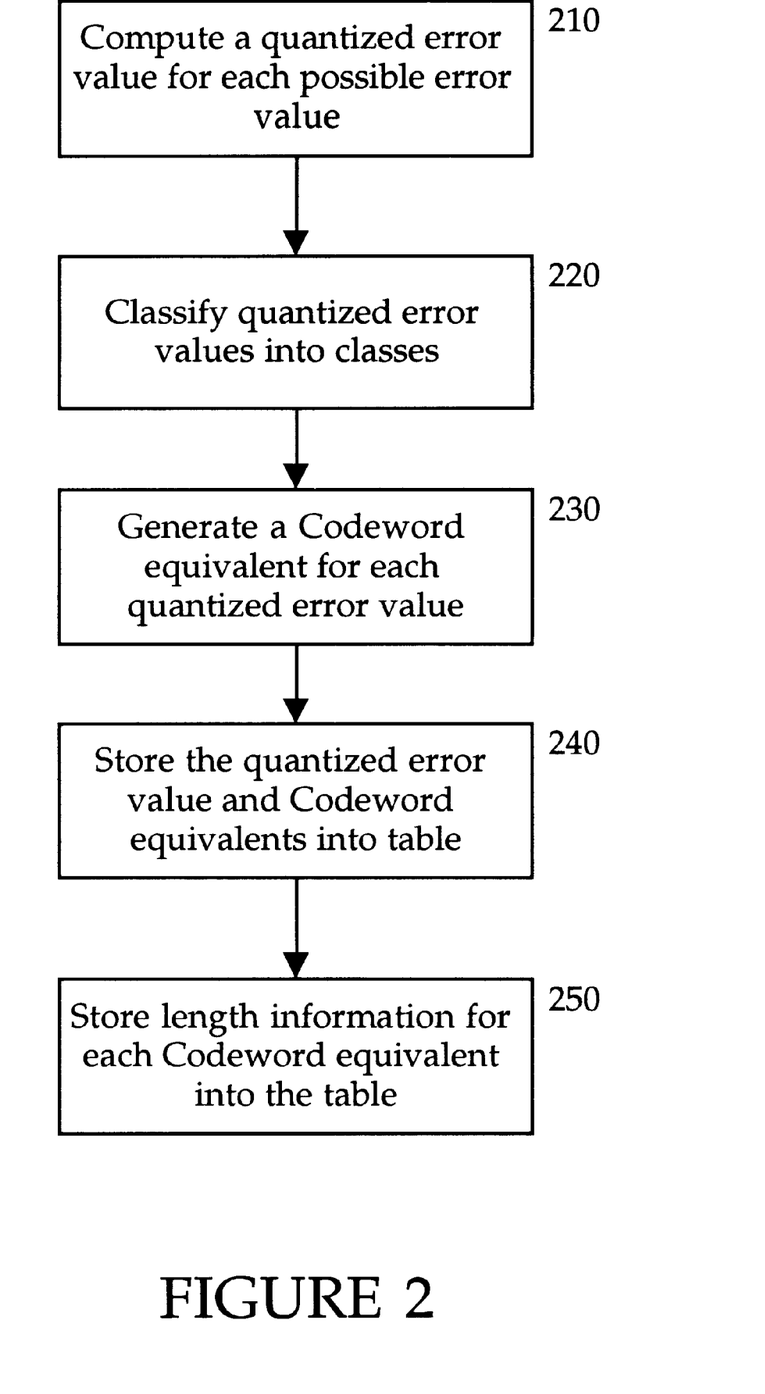
FIG. 2 is a detailed flow diagram of compiling an image compression table according to one embodiment of the invention.

FIG. 2 is a detailed flow diagram of pre-compiling an image compression table according to one embodiment of the invention.

The first step in pre-compiling an image compression table is to compute a quantized error value for each designated error value. An image pixel can be split into R, G and B plane components and, assuming that N bits is utilized for each color plane, then the pixel in total would be defined in 3*N bits. Predictive coding schemes operate on each color plane independently and simultaneously. Thus, the error, which is the difference between a predicted pixel component and the original pixel component, would range from $-(2^N-1)$ to $2^N-1$ yielding a total number of possible error value of $2^{N+1}-1$. For example, a 24-bit color image would consist of pixels that have 8-bit R components, 8-bit G components and 8-bit B components. For each pixel component, the lower limit of error is 0−255=−255, while the upper limit is 255−0=255, giving a total of $2_{8+1}-1=511$ error values. According to step 210, then, for each of the $2^{N+1}-1$ error values, a quantized error value is calculated. The quantized error value, according to the visually-lossless scheme proposed in various embodiments of the invention, takes the form of $y=(x-c)^a+C$, where y is the quantized error, x the original error and C, the threshold, and "a" the entropy encoding factor derived from the response of the human visual perception system (response of the human optical system to visual input and its interpretation by the human brain). Further details of the quantization computation are described below with respect to FIG. 4.

The above example is a form of predictive coding which can be one or multi-dimensional in its prediction. A one-dimensional would take as a predicted pixel component, the predicted "West" neighboring pixel component, which is the pixel component (R,G,B) of the same row, but the previous column in the image. A two-dimensional predictive coding scheme will first take, for instance, the predicted "North" pixel component neighbor and the "West" neighbor and average the two together. This average of previous predicted pixel components is then subtracted from the current original image pixel to obtain the error value. To minimize the propagation of errors due to quantization of these error values, a feedback recovery may be applied to "recover" by inverse quantization and approximation of the error. This approximation obtained by inverse quantization can be summed with the predicted pixel component (or average) to recover the error, at least in part.

Referring still to FIG. 2, the next step in the process is to classify the quantized error values into a distinct set of classes (step 220). The number of classes will depend upon both the number of bits required to encode the quantized error value and upon the value of C, the threshold in the quantized error formula. Binary encoding which is utilized in this embodiment of the invention is inherently bitwise. Thus, the decoding of a binary coded value is computationally complex since bitwise processing is necessary. However, by classifying the quantized error values, the decoding of the generated Codeword equivalent is greatly simplified. An example is provided below. After classifying the quantized error values, a Codeword equivalent can be generated for each quantized error value (step 230). Each quantized error value can be represented by a pair of binary values (H,M), where H is the Huffman code of the class and M is the one's complement representation of the quantized error value in that class. The pair (H,M) when concatenated together as the sequence of bits "HM" represents the prefix Codeword. As will be shown, this prefix Codeword greatly simplifies the decoding process. Once the Codeword equivalent is generated for each quantized error value, the integrated quantized error values and their corresponding Codeword equivalents are stored into the image compression table (step 240). Further, the next step is to store, for each Codeword equivalent, the bit length of the Codeword equivalent (step 250).

The Codeword equivalent generated by the (H,M) pair is a variable length prefix code. The Codeword equivalent is stored into a table as a decimal value, e.g., if the Codeword equivalents of unquantized error values 2, 25, 100 are 0, 10111, 111010, they are stored into the table in a byte as a decimal value 0, 23, 58, respectively. Though the Codeword equivalents 0, 23, and 58 are actually stored in eight bits (bytes) as 00000000, 00010111, 00111010, respectively, only one bit is significant for the Codeword equivalent 0. Likewise, only the last 5 bits of 00010111 are significant for the Codeword equivalent 23 and only the last 6 bits of 00111010 is significant for the Codeword equivalent 58. Hence, since all Codeword equivalents are stored optimally as the same number of bits, length information is desired to be able to extract the variable length code from the memory bytes of the look-up table. The variable-length Codeword equivalents are packed together in eight-bit bytes and output to the compressed file. For example, let us assume that the quantized error values are 99, 25, −2, 0, 9, 0, 0, 55, 100, the output codes are 111011, 10110, 0, 0, 10101, 0, 0, 111000, 111011. They are packed in eight-bit bytes as

| byte 1 | byte 2 | byte 3 | byte 4 |
|---|---|---|---|
| 11101110 | 11000101 | 01001110 | 00111011 | and output to the compressed file. Hence, the length information is needed to prepare the output bytes such that they be "unpacked" correctly upon decompression.

The image compression table(s) can contain an index of quantized error values and for each quantized error value, the Codeword equivalent and the length of the Codeword equivalent. The same table can be utilized for all the color planes. Thus, the image compression table at most has $2^{N+1}-1$ indexes or addresses where N represents the number of bits in each color component (R,G,B) of the pixels in the image. The procedure of pre-compiling the image compression table need only be performed once and can be applied to each color plane without modification. Thus, the R, G and B compression processes can share a single image compression table.

The image compression table, by representing Codeword equivalents for quantized error values, integrates the quantization and binary encoding process. The table integrates quantization and binary encoding by providing, for each quantized error code submitted as an index to the table, a Codeword equivalent. Thus, the steps architecture of separate binary encoding is eliminated.

FIG. 3 is a flowchart of yet another embodiment of the invention.

A single image compression table represents a particular image quality or compression ratio. Testing and experimentation have shown that for the quantized error formula $y=(x-C)^a+C$, a value of "a"=0.45 derived from human visual system response gives excellent visually-lossless properties. Such visually-lossless image compression is excellent for still images since it represents "perception" of the human brain of received visual stimulus such as color and shape. The threshold value, C, has also be found through testing to be good at a value of 3. The rigors of the formula are described below. If a different level of compression is desired, the level of "visual-losslessness" may be reduced and the image compression ratio increased.

The human visual perception system, upon which various embodiments of the invention are based, consists of the optical system (lens, cornea, etc.) as well as the brain and nervous systems which interpret what the eye gathers from its surroundings. The eye and human optical system will, based on reflected light, send to the brain a set of image data much like a camera but far less discrete. The brain interprets what the eye "captures" and this interpretation is what is "seen" by humans. The fineness of the image, clarity, and color resolution depends on the discernibility of the part of brain processing visual stimuli. Thus, if the human eye can only distinguish, for example, 1,000,000 colors, for the purposes of presenting it to a human an image printed or displayed with more colors is extraneous. Likewise, certain other characteristics of the human visual perception system such as edge detection can, if understood, be used to simplify the image compression scheme for an application such as a digital camera.

In the digital camera instance, the modeling of the human visual perception system will produce the "visually-lossless" result referred to in various embodiments of the invention. The formula for quantization $y=(x-C)^a+C$ with an "a" of 0.45 and "C" of 3 closely models the human visual perception system to still images. The error is tolerable and virtually indistinguishable to the naked eye if those parameters are utilized. Though the invention in various embodiments contemplates the use of look-up tables so that the quantization is pre-computed and compiled, one skilled in the art would readily be able to adopt the human visual perception modeling herein to a non-look-up table based approach, where quantization is computed on-the-fly. One such approach may include software compression where a computer programmed application executes visually-lossless compression using $y=(x-C)^a+C$ or a variation thereof, within the computer system on an already stored image or upon images that are streamed to the application.

Different image compression ratios and qualities will be desired for different types of applications. To facilitate this, the user of the imaging system can select on the data processing system on which the table is pre-compiled or from the camera/imaging system the desired quality and/or compression level (step 310). Next, the software queries the memory or disk where image compression tables may be stored if the image compression table corresponding to the desired quality/compression level exists (step 320). If the corresponding image compression table does exist, then the data processing system loads the corresponding table into the camera/imaging system (step 340). In an alternative embodiment, more than one different image compression table may be stored in the camera/imaging system, but in small digital cameras, a single optimal table at any given time is adequate and least intrusive. If the camera/imaging system were to have multiple table capability, then the imaging system may as well be queried for already containing the proper table.

If no corresponding image compression table exists, the next step is to set a gamma, "a", and a threshold C for the quantized error value formula $y=(x-C)^a+C$ (step 330). The gamma and threshold values will vary from compression scheme to compression scheme, but can be readily tabulated to be available in case a certain scheme (compression ratio/quality) is desired. Using the gamma and threshold corresponding to the desired scheme, the next step is to compile a new image compression table using those values (step 335). The compiling of the image compression table has been described with respect to FIG. 2.

Once the image compression is located or compiled, the table is loaded into the camera (step 340). After the table is loaded into the camera, images may be compressed on the camera (step 350). These images will have a quality/compression ratio commensurate with the selected quality/compression. Alternatively, the selection of quality/compression ratio may be arrived at automatically by the data processing system or imaging system based on the specific application which will use the image.

Figure 4:
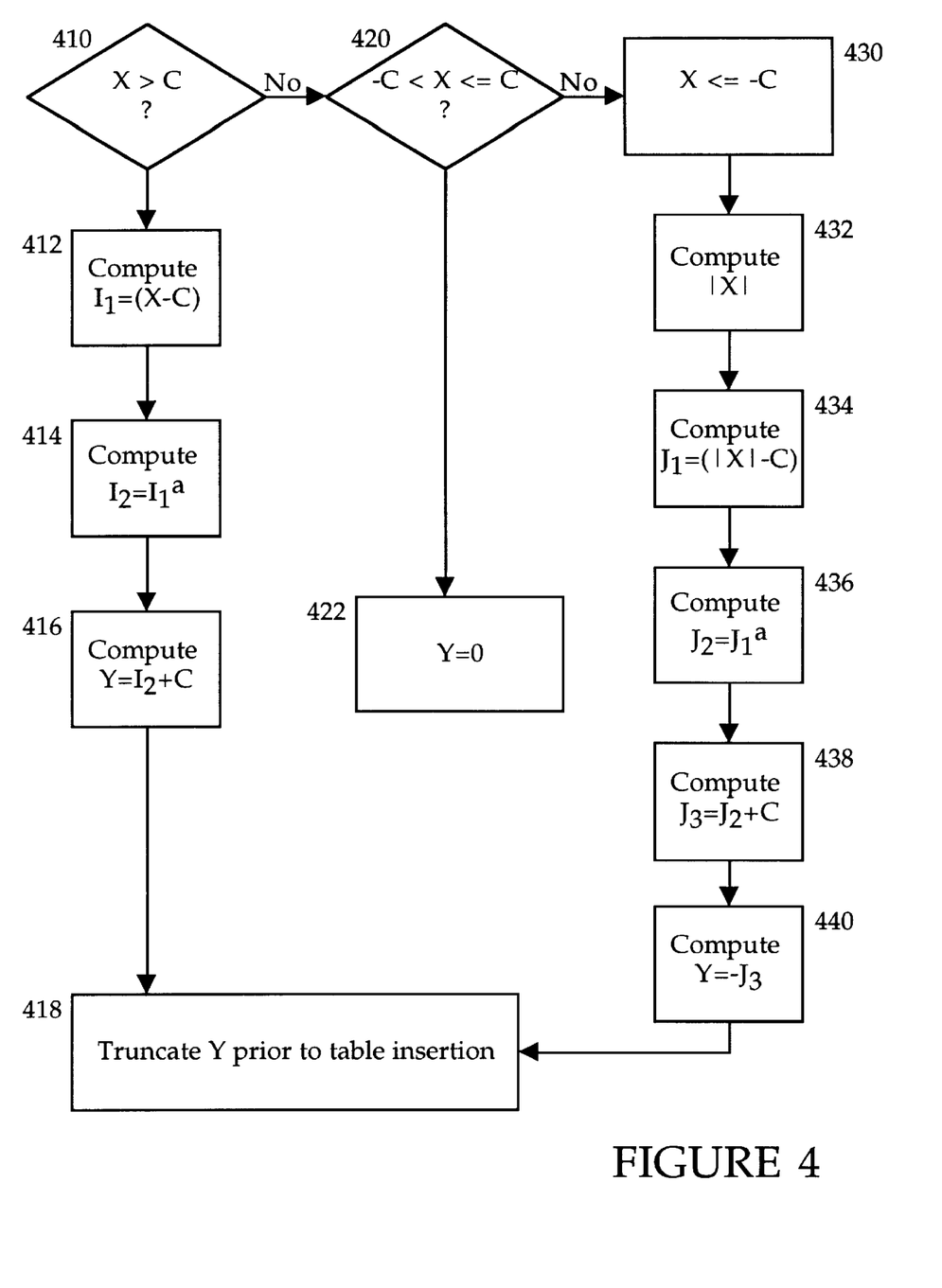
FIG. 4 is a flowchart of computing quantized error values according to one embodiment of the invention.

FIG. 4 is a flowchart of computing quantized error values according to one embodiment of the invention.

Assuming that the gamma "a" and threshold C are already determined, the following methodology is used to compute quantized error values. The appropriate form of the basic equation $y=(x-C)^a+C$ depends upon the range of x, the error value. If x is greater than C (checked at step 410), then the form $y=(x-C)^a+C$ is applied. To apply this form, the first step is to calculate the intermediate value $I_1=(x-C)$ (step 412). Next, $I_1$, is raised to the power of a to yield $I_2$ (step 414). Finally, the value of C is added to the value $I_2$ to arrive at Y1 which will be a positive quantized error value (step 416). only the integer portion of the quantized error value y is stored, and thus, the value y is to be truncated (step 418) prior to table insertion.

If x is greater than −C but less then or equal to C (checked at step 420), then y is judged to be zero (step 422).

If the error value falls below −C (checked at step 430), then the next step is to take the absolute value of the error value (step 432). Then, the intermediate value $J_1$ is calculated by subtracting C from the absolute value of the error value (step 434). Next, $J_1$ is raised to the power a, to yield $J_2$ (step 436). Next, the value C is added to $J_2$ to form $J_3$ (step 438). Finally, since the error value is a negative number, the quantized error value should also be a negative. This is achieved by negating $J_3$ (step 440). These quantized error values are utilized to compress an image by compressing the error of the image.

Figure 5:
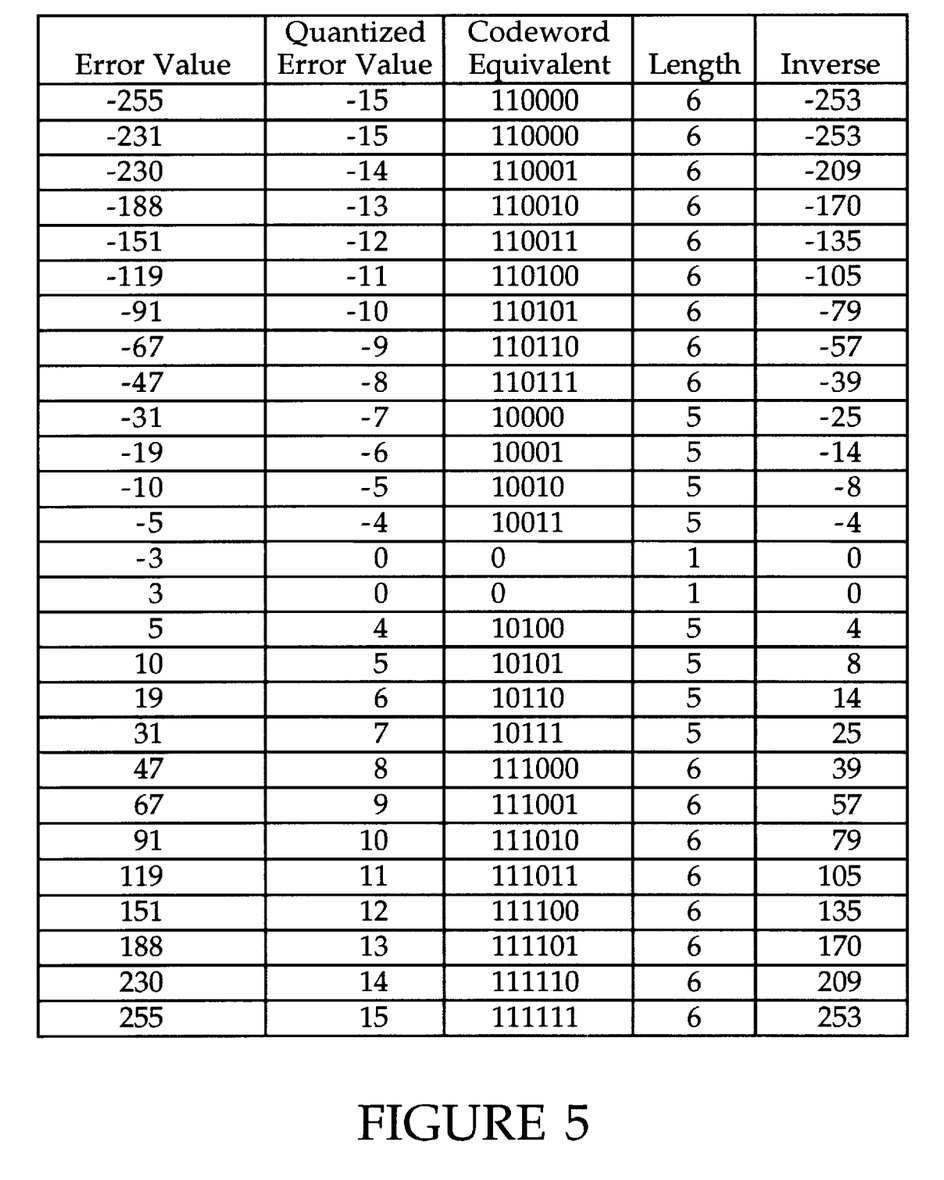
FIG. 5 is an image compression table with sample values according to one embodiment of the invention.

FIG. 5 is an image compression table with sample values according to one embodiment of the invention.

The table of FIG. 5 has sample values for 8-bit color plane values. Each color plane, R, G and B, if composed of 8 bits will yield an image when decompressed with pixels of 24-bit color resolution. The image compression table of FIG. 5 is equally applicable to all three color planes, since all three planes have the same range of possible error values. As described above, the possible error values between a pixel and a predicted pixel will be −255 to +255 for each plane assuming 8-bit color planes. The table of FIG. 5 shows 28 of the possible 511 error values as they would be quantized. One embodiment of the invention calculates the quantized error value using the expression $y=(x-C)^a+C$, where x is the error value (column 1 of FIG. 5) and y, the quantized error value (truncated, column 2 of FIG. 5). The quantized error values shown in FIG. 5 correspond to a gamma "a" value of 0.45 and a threshold C of 3. As FIG. 5 shows, by applying the methodology of FIG. 4 with a=0.45 and C=3, 511 error values have been compacted into only 25 quantized values. Though these error values relate to only one R, G or B pixel, interpolation may be used to combine neighboring pixels into a higher, such as 24-bit pixel, resolution image.

Once the quantized error values shown in column 2 of FIG. 5 are compiled, then classification of the error values can be performed. The threshold C determines the classification by identifying the number of classes. In this case, C is 3, so the number of classes is 3. The first class, class 0, are the error values that lie between −C and C, or in this example, −3 and 3. All these error values correspond, using the methodology of FIG. 4, to quantized error values of 0. The second class, class 3 is so named because a maximum of three bits are preferred to encode the unsigned quantized error values between 4 and 7 and −4 and −7. The next class, class 4, consists of the quantized error values between 8 and 15 and −8 and −15 which require four bits to encode.

Once classification is achieved for the quantized error values, then the Codeword can be constructed. The Codeword equivalent for each quantized error value takes the form "HM" where H is the Huffman code of the class to which the quantized error value belongs and M is the binary representation of the quantized error value. Negative quantized error values take on M values of the binary complement of the unsigned number in its binary form. The Huffman code of the class and M are concatenated to form the Codeword equivalent. As a first example, an error value of 31 has a quantized error value (as computed with a=0.45 and C=3) of 7. A quantized error value of 7 belongs to class 3. The Huffman code of "3" is "10" and thus, H is 10. The value 7 in binary form is 111 in three bits, and thus, M is 111. Thus, the Codeword equivalent for a quantized error value of 7 is "HM" or 10111. The value "110111" is stored next to the quantized error value of 7. As an second example, an error value of −119 has a corresponding quantized error value of −11. −11 belongs to class 4, and thus H (the Huffman code of "4") is 11 (binary). M is the complement of the unsigned decimal number 11 which is "0100." Thus, the Codeword equivalent is "110100" for a quantized error value of −11.

The quantized error values and Codeword equivalents are likewise compiled for all possible quantized error values between −255 and 255. As discussed above, the length of each Codeword equivalent should also be stored in order to packing of the Codeword equivalents into suitable data structures for communications transport. The Codeword equivalents represent an integration of the traditional distinct processes of quantization and encoding.

Additionally, the image compression table can also store the inverse of the quantized error values. When the image is being recovered or decomposed, the inverse quantized error values are utilized. The inverse quantized error values are calculated by using the formula $X_{inv}=(y-C)^a+C$, where y is the quantized error value and $X_{inv}$ is the inverse quantized error value. Though the inverse values only approximate the original error values prior to quantization (e.g., 255 is quantized as 15, and inversed as 253), this is quite adequate for visually-lossless compression since the error introduced is imperceptible by the human visual perception system.

Figure 6:
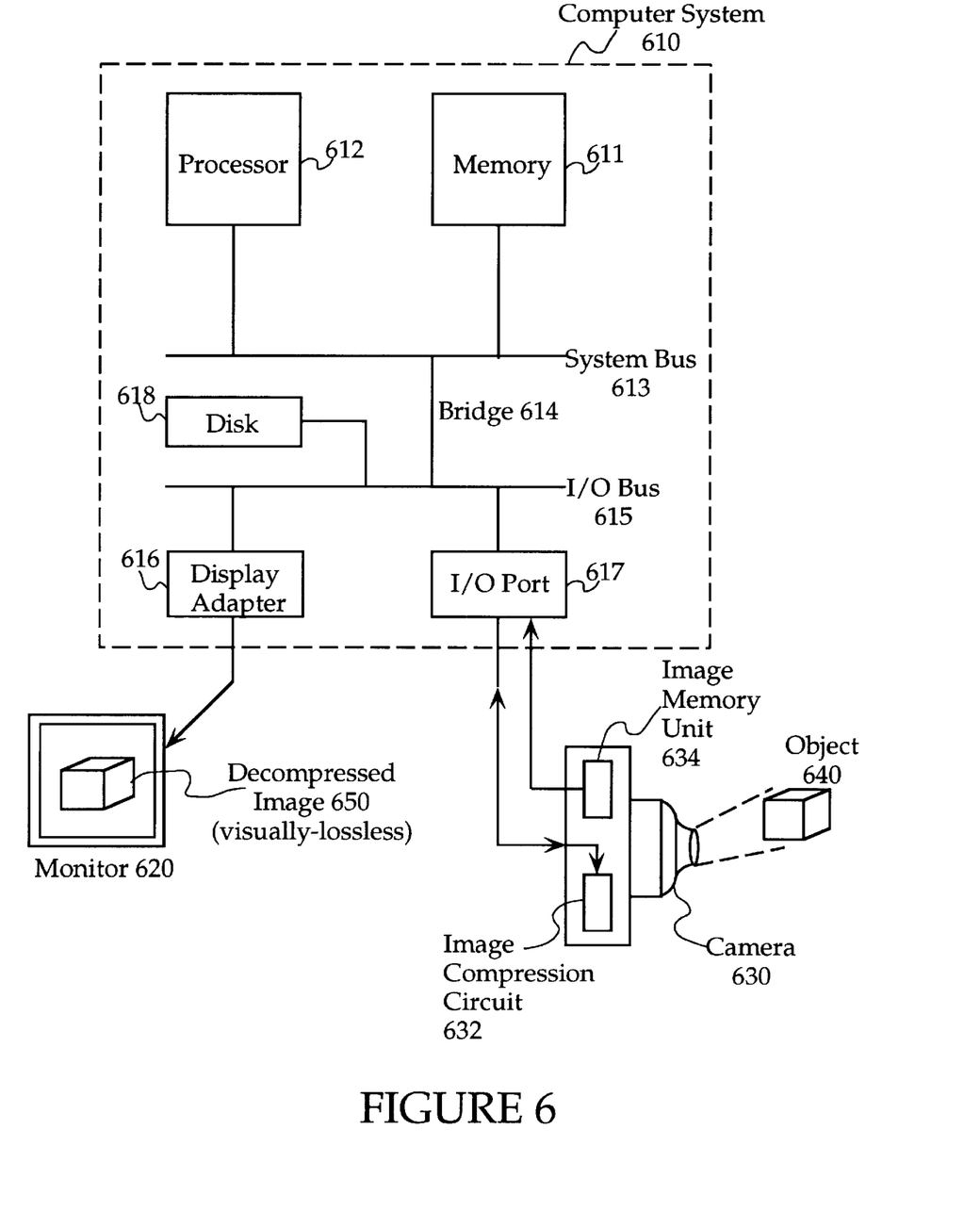
FIG. 6 is a system diagram of one embodiment of the invention.

FIG. 6 is a system diagram of one embodiment of the invention.

Illustrated is a computer system 610, which may be any general or special purpose computing or data processing machine such as a PC (personal computer), coupled to a camera 630. Camera 630 may be a digital camera, digital video camera, or any image capture device or imaging system, and is utilized to capture a sensor image of an object 640. Essentially, captured images are compressed by an image compression circuit 632 so that they can be efficiently stored in an image memory unit 634, which may be a RAM or other storage device such as a fixed disk, miniature card, etc. In most digital cameras, images are stored first and downloaded later. This allows the camera 630 to capture the next object quickly without additional delay.

Image processing in this embodiment of the invention operates as follows. First, an image compression table, if not already compiled, is compiled using computer system 610. The methodology described in various other embodiments of the invention is executed using a processor 612 such as the Pentium™ (a product of Intel Corporation) and a memory 611, such as RAM, which is used to store/load instruction addresses and result data. The application used to compile the image compression table may be an executable file compiled from source written in a language such as C++. The instructions of that executable file, which correspond with instructions necessary to compute quantized error values, Codeword equivalents and index these and other values into a table, which may be stored to a disk 618 or memory 611. It would be obvious to one of ordinary skill in the art to program a computing machine to compile the image compression table, provided that the described methodology is disclosed.

Computer system 610 has a system bus 613 which facilitates information transfer to/from the processor and memory and a bridge 614 which couples to an I/O bus 615. I/O bus 615 connects various I/O devices such as a display adapter 616, disk 618 and an I/O port, such as a serial port. Many such combinations of I/O devices, buses and bridges can be utilized with the invention and the combination shown is merely illustrative of one such possible combination.

Once the table is compiled, it can be sent through I/O port 617 and loaded into image compression circuit 632 as a RAM or memory utilized by the image compression circuit 632. The table, once loaded, can thereafter be utilized by the image compression circuit 632.

When an image, such as an image of object 640, is captured, the image is sensed by R, G, and B pixels and these pixel values are sent to the image compression circuit 632. Image compression circuit 632 consists of ICs and other components which execute an image compression scheme such as predictive coding. The image compression circuit 632 calculates initial error values according to a predictive coding formula, and then, looks up both the corresponding quantized error value and Codeword equivalent for the error value and stores that into the image memory unit 634. By looking up the values in the image compression table, the steps of quantization and encoding do not have to be performed by the camera. The total cost of the camera is reduced by avoiding the additional circuitry used to perform quantization and encoding of error values. Once all pixels are processed for the image, the camera 630 can capture the next image. When the user or application desires/requests a download of images, the compressed images stored in the image memory unit as packed Codewords are transferred from image memory unit 634 to the I/O Port 617. I/O port 617 uses the bus-bridge hierarchy shown (I/O bus 615 to bridge 614 to system bus 613) to temporarily store the Codeword into memory 611 or, optionally, disk 618. The compressed images are decompressed by suitable application software (or hardware), which may utilize processor 612 for its execution. Since the image compression table will have been compiled on the computer system, it can be reused to "look-up" in reverse the actual error value corresponding to the Codeword. The error values are used in an inverse predictive coding (or other corresponding image decompression scheme) to produce a decompressed image 650. Decompressed image 650 may then be rendered visually using a display adapter 616 onto a monitor 620 to which the computer system 610 may be connected.

The decompressed image 650 will be "visually-lossless" if an image compression table with an "a" value of 0.45 and a threshold C of 3 is compiled and used in camera 630. The image is visually-lossless since the formula $y=(x-C)^a+C$, when utilized to compute and compile the image compression table will model the human visual system. Thus, to the user, the decompressed image 650 will appear virtually indistinguishable, given adequate display devices (monitor 620 and adapter 616), with the appearance of the original object 640. Likewise, other images captured by the camera can be decompressed and output on monitor 620 and each will maintain a visually-lossless quality if the methodology of the various embodiments of the invention and alternatives thereof, are followed.

The exemplary embodiments described herein are provided merely to illustrate the principles of the invention and should not be construed as limiting the scope of the invention. Rather, the principles of the invention may be applied to a wide range of systems to achieve the advantages described herein and to achieve other advantages or to satisfy other objectives as well.

What is claimed is:

1. A method comprising the steps of:
   generating an image compression table that models a visually-lossless image compression scheme, said scheme polynomially relating an error value, which is the difference between two pixels, and a quantized error value, said Polynomial characterized by the human visual perception system; and
   utilizing said image compression table for compressing an image, said compressed image appearing visually-lossless upon decompression.

2. A method according to claim 1 further comprising the step of loading, prior to the step of utilizing, said table into an image capture system.

3. A method according to claim 2 further comprising the step of compressing, after loading said table, images captured by said image capture system, by applying values of said table to said captured images.

4. A method according to claim 3, further comprising the step of downloading said compressed images to a computer system.

5. A method according to claim 1 wherein the step of generating further comprises the steps of:
   computing, using said visually-lossless quantization scheme, a quantized error value for each of a set of possible error values, said set a result of all combinations of the difference between one pixel value of said image and another; and
   generating for each of said quantized error values, a corresponding Codeword equivalent, each said quantized error value and corresponding Codeword equivalent stored in said table for each of said possible error values.

6. A method according to claim 5 further comprising the step of classifying said quantized error values into a distinct set of classes.

7. A method according to claim 5 further comprising the step of:
   storing length information for each said Codeword equivalent into said table.

8. A method according to claim 5 further comprising the step of:
   computing and storing into said table an inverse error value, said inverse error value exponentially related to said quantized error value.

9. A method comprising the steps of:
   compiling quantized error values and Codeword equivalents for a given image compression scheme into a look-up table, said values modeling visually-lossless image compression said compression the result of said scheme polynomially relating an error value, which is the difference between two pixels, and a quantized error value, said polynomial characterized by the human visual perception system; and
   utilizing said look-up table for image compression without re-compiling said values thereafter for a given image compression scheme.

10. A method according to claim 9 wherein said step of compiling is achieved independent of the characteristics of the images being compressed.

11. A method according to claim 9 further comprising the step of compiling a second table of values for image compression if the given image compression scheme is modified.

12. A method according to claim 11 wherein the particular image compression scheme is modified based on a choice of desired image quality by a user.

13. An imaging system including an image capture device comprising:
   an image compression module receiving input from said image captive device; and a image compression table coupled to said image compression module, said image compression table providing quantized error values and Codeword equivalents thereof which are utilized to compress images, said quantized error values modeling the human visual system, said scheme polynomially relating an error value, which is the difference between two pixels, and a quantized error value, said polynomial characterized by the human visual perception system.

14. An imaging system according to claim 13 wherein said image compression module and said look-up table are for coupling to an image capture device.

15. An imaging system according to claim 13 wherein said image capture device is for coupling to a computer system, said computer system configured to compile said quantized error values and said Codeword equivalents for said image compression table.

16. An imaging system according to claim 14 wherein said image capture device is configured to store said compressed images.

17. An imaging system according to claim 14 wherein said image capture device is configured to transfer compressed images to a computer system.

18. An imaging system according to claim 14 wherein said image capture device is coupled to a computer system, said computer system configured to decompress and render said compressed image to an output device, further wherein said output device rendering a decompressed image that is visually-lossless.

19. An imaging system according to claim 13 wherein said table integrates quantization and encoding of image error values.

* * * * *

UNITED STATES PATENT AND TRADEMARK OFFICE
CERTIFICATE OF CORRECTION

PATENT NO. : 6,009,201
DATED : December 28, 1999
INVENTOR(S) : Tinku Acharya

It is certified that error appears in the above-identified patent and that said Letters Patent is hereby corrected as shown below:

In column 3 at line 54, after "of", delete "$2_{8+1} - 1 = 511$", and insert -- $2^{8+1} - 1 = 511$ --.

In column 7 at line 63, after "value" delete "110111", and insert --10111--.

Signed and Sealed this

Fifth Day of December, 2000

Attest:

Q. TODD DICKINSON

*Attesting Officer*  *Director of Patents and Trademarks*